(12) United States Patent
Benjamin et al.

(10) Patent No.: US 8,635,038 B2
(45) Date of Patent: Jan. 21, 2014

(54) SYSTEM FOR MONITORING THE STATE OF A BATTERY

(75) Inventors: Sebastien Benjamin, Leognan (FR); Philippe Desprez, Bordeaux (FR); Gerard Barrailh, Gradignan (FR); Philippe Laflaquiere, Bordeaux (FR)

(73) Assignee: SAFT, Bagnolet (FR)

( * ) Notice: Subject to any disclaimer, the term of this patent is extended or adjusted under 35 U.S.C. 154(b) by 235 days.

(21) Appl. No.: 13/159,981

(22) Filed: Jun. 14, 2011

(65) Prior Publication Data

US 2011/0307202 A1 Dec. 15, 2011

(30) Foreign Application Priority Data

Jun. 15, 2010 (FR) ...................... 10 54707

(51) Int. Cl.
*G06F 19/00* (2011.01)
(52) U.S. Cl.
USPC .............. 702/63; 702/64; 320/104; 320/118; 320/155
(58) Field of Classification Search
USPC ................. 702/63–64; 320/104, 155, 118
See application file for complete search history.

(56) References Cited

U.S. PATENT DOCUMENTS

| | | | |
|---|---|---|---|
| 5,675,258 A | 10/1997 | Kadouchi et al. | |
| 5,739,670 A * | 4/1998 | Brost et al. | 320/131 |
| 6,094,031 A | 7/2000 | Shimane et al. | |
| 2003/0025481 A1* | 2/2003 | Bertness | 320/155 |
| 2003/0030442 A1 | 2/2003 | Sugimoto | |

FOREIGN PATENT DOCUMENTS

| | | |
|---|---|---|
| JP | 2000-150002 A | 5/2000 |
| JP | 2009-037962 A | 2/2009 |

OTHER PUBLICATIONS

European Search Report for EP 11 16 8849, Oct. 6, 2011.

* cited by examiner

*Primary Examiner* — Jonathan C Teixeira Moffat
*Assistant Examiner* — Hien Vo
(74) *Attorney, Agent, or Firm* — Sughrue Mion, PLLC (57) ABSTRACT

The invention is a monitoring system for a battery having a plurality of accumulators. The system comprises apparatus for measuring the voltage on the terminals of each accumulator; measuring the temperature of the battery; measuring the current flowing through the battery, calculating a voltage difference between a maximum voltage measured on the terminals of one of the accumulators and a minimum voltage measured on the terminals of one of the accumulators; comparing the voltage difference with at least one threshold value depending on the measured temperature and current, and reporting an error if the voltage difference is greater than or equal to the at least one threshold value.

13 Claims, 6 Drawing Sheets

SYSTEM FOR MONITORING THE STATE OF A BATTERY

BACKGROUND

The present invention relates to a monitoring system for a battery with which it is possible to indicate whether the battery has to be replaced or not.

An electrochemical generator or accumulator (both of these terms are equivalent) is a device for producing electricity in which chemical energy is converted into electric energy. The chemical energy is formed by electrochemically active compounds deposited on at least one face of electrodes positioned in the accumulator. The electric energy is produced by electrochemical reactions during a discharge of the accumulator. The electrodes, positioned in a container, are electrically connected to current output terminals which ensure electric continuity between the electrodes and an electric consumer with which the accumulator is associated.

Typically a battery comprises a plurality of accumulators also called electrochemical generators, cells or elements. A battery may be divided into modules, each module consisting of a plurality of accumulators connected together in series and/or in parallel. Thus the battery may include one or more parallel branches of accumulators connected in series. The battery is intended to provide electric energy to an external application. A charging circuit is generally provided to which the battery may be connected for recharging the accumulators. A management system comprising measurement sensors and an electronic control circuit which is more or less developed depending on the applications may be associated with the battery.

PRIOR ART

The state of charge (SOC) and the state of health (SOH) are useful pieces of information for the electronic management system of the battery in order to optimize its use and its lifetime.

In a battery, the self-discharge current may vary from one accumulator to the other. The state of charge may thus not be uniform for all the accumulators of the battery. This problem of balancing the state of charge between accumulators of a battery is well known. An electronic system may then be used for balancing the state of charge of the different accumulators relatively to each other.

Typically, the state of charge SOC is determined as the amount of energy available in the battery relatively to the energy of a totally charged battery. The state of charge SOC may for example be calculated according to an algorithm using voltage measurements or the integration of the charging/discharging current over time.

The state of health SOH of the battery allows an estimation of the aging of the battery between new condition and end-of-life condition. The SOH may be calculated from the ratio of the impedance of the battery at a given instant over the impedance of the battery in its new condition at the same temperature. The SOH may also be calculated from the ratio of the capacity of the battery at a given instant over the capacity of the battery in its new condition at the same temperature. Such an SOH algorithm is said to be dynamic.

Depending on the size of the battery, the SOH may be calculated at the level of the battery, at the level of the module or at the level of the accumulator. On batteries including many accumulators, an estimation of the SOH for each accumulator is a constraint and imposes additional cost as regards the electronic circuits. Indeed, the large number of calculations to be performed generates computation power constraints on the processing unit of the electronic control circuit.

Another method for determining the SOH of a battery consists of monitoring the values of temperature, and of voltage and optionally of current of the battery in order to determine an SOH value from aging laws. These aging laws are obtained from tests conducted in the laboratory. This so-called static SOH algorithm then gives an estimation of the aging of the battery. However this method for determining the SOH of the battery is subject to the assumption of homogeneous aging of the accumulators of the battery. The method for determining the SOH through a predictive model also assumes a faultless power circuit between the accumulators.

Thus, most batteries integrate a management system providing services for estimating the state of charge of the accumulators, for estimating their state of health, and for balancing their state of charge, in order to optimize the use of the battery.

Further, most management systems for a battery integrate monitoring systems in order to guard against one or several events which may result in abusive use of the battery. Abusive use may cause a threatening event such as a fire. Thus, the monitoring system may detect if the voltages of the accumulators, of the modules or of the battery are greater than a maximum threshold. The monitoring system may also detect whether the voltages of the accumulators, of the modules or of the battery are less than a minimum threshold. The monitoring system may also detect whether the temperature of the battery is above a maximum threshold, or whether the temperature of the battery becomes less than a minimum threshold.

However, the monitoring systems described earlier do not give the possibility of warning a user in the case of premature failure of the battery which may cause an event requiring replacement of the battery.

For example, a failure may be a loss of capacity of the battery, which may be accompanied by threatening events such as a risk of high voltage at the accumulator and heating up of the battery. A loss of the capacity of the battery may be caused by a failure of the balancing circuit.

Another failure may be a significant dispersion among the resistances of the accumulators (here, the resistance of an accumulator also comprises the resistance of the connections between the power circuit and the power terminals of the accumulator). This may cause threatening events such as a local hot point, and non-guaranteed available energy due to a too high ohmic drop relatively to normal aging of the battery.

Another failure may be the open-circuit of an accumulator when one or several accumulators are connected in parallel. In this case, a threatening event may be non-guaranteed available energy. Another threatening event may be a too large current flowing through the accumulators located in the non-failing branches. This may lead to a safety problem if the non-failing accumulator branches are not dimensioned for letting through this excess current; and if the non-failing accumulator branches are dimensioned for allowing this excess current to be let through, this generates a bulk energy loss of the battery.

In standard management systems, only an estimation of the dynamic impedance at the accumulator allows detection of the problem of resistance dispersion. For this, a dynamic SOH algorithm has to be used, for example of the extended Kalman filter type as described in document U.S. Pat. No. 7,315,789 for example; but as a counterpart, overdimensioning of the processing unit of the electronic control circuit is required. Further, this type of algorithm does not detect a malfunction of the balancing system since it only estimates the parameters of the electrochemical accumulators and therefore does not operate on the battery system as a whole.

Documents JP-A-2000150002, JP-A-2002334726, JP-A-2003257504, or further JP2009037962 propose systems for detecting battery failures from voltages measured on the terminals of the accumulators of the battery. However, the systems shown in these documents only detect an overdischarge of an accumulator of the battery but do not allow detection of dispersion among the resistances of the accumulators, of a loss of the capacity of the battery or a failure of an accumulator in an open circuit.

SUMMARY OF THE INVENTION

An electronic system is therefore sought for a battery allowing detection of the faults described earlier.

For this purpose, the present invention proposes a monitoring system for a battery having a plurality of accumulators, the system comprising:

means for measuring the voltage at the terminals of each accumulator;
means for measuring the temperature of the battery;
means for measuring the current flowing through the battery;
means for calculating a voltage difference between a maximum voltage measured on the terminals of one of the accumulators and a minimum voltage measured on the terminals of one of the accumulators;
means for comparing the voltage difference with at least one threshold value depending on the measured temperature and current; and
means reporting an error if the voltage difference is greater than or equal to said at least one threshold value.

According to an alternative, at least one of the error reporting means is disabled if the absolute value of the measured current leaves a range of threshold current values, the range of values being specific to the threshold value.

According to an alternative, the voltage difference is compared with a threshold value $\Delta Vs1$ defined as $$\Delta Vs1 = n \times R(T) \times \frac{Ibat}{p-1},$$

wherein p is the number of parallel branches of accumulators of the battery, with p≥2, and n is the number of accumulators connected in series in each branch, $R(T)$ is the resistance at the beginning of the life—depending on temperature—of the electrochemical accumulators forming the battery, and Ibat is the current flowing through the battery.

According to an alternative, the voltage difference is compared with a threshold value $\Delta Vs2$ defined as $$\Delta Vs2 = \Delta R_{max}(T) \times \frac{Ibat}{p}$$

wherein p is the number of parallel branches of accumulators of the battery, $\Delta R_{max}(T)$ is the maximum tolerated dispersion—depending on temperature—among the internal resistances of the accumulators, and Ibat is the current flowing through the battery.

According to an alternative, the monitoring system is for a battery having accumulators assembled in a plurality of parallel branches, the system further comprising:

means for measuring the current flowing through each branch of the battery;
means for comparing the current of each branch with a first threshold and with a second threshold;
means of reporting an error if, for one of the branches of the battery, the measured current is less than or equal to the first threshold and if, for another of the branches of the battery, the measured current is greater than or equal to the second threshold.

According to an alternative, the voltage difference is compared with a predetermined threshold value when the current of the battery is substantially zero.

The invention also relates to a battery supervision system comprising:

a monitoring system according to the invention, and
a means for determining the state of charge (SOC) of the battery.

According to an alternative, the battery supervision system comprises:

means for determining the state of charge (SOC) of each accumulator of the battery,
means for determining the dispersion of the state of charge of the accumulators,
said at least one threshold value being corrected if the dispersion of the state of charge is greater than a predetermined value.

The invention also relates to a supervision system for a battery comprising:

a monitoring system according to the invention,
a means for determining the state of health (SOH) of the battery from a predictive model,
wherein, if the voltage difference is greater than at least one threshold value, the error reporting means indicate that the predictive model for determining SOH is invalid.

The invention also relates to a supervision system for a battery comprising:

a monitoring system according to the invention, and
a system for balancing the charge of the accumulators of the battery.

The invention also relates to a supervision system for a battery according to the invention in which the error reporting means of the monitoring system give the possibility of warning a user.

BRIEF DESCRIPTION OF THE DRAWINGS

Other features and advantages of the invention will become apparent on reading the description which follows, given as an example and with reference to the figures which show.

DETAILED DESCRIPTION

The invention relates to a monitoring system for a battery having a plurality of accumulators. The monitoring system of the invention allows detection of premature failure of the battery, i.e. a failure not coming under predictable aging of the battery. Thus, with the monitoring system, it is possible to detect a loss of the capacity of the battery, high dispersion among the resistances of the accumulators, and an accumulator being open-circuited. The indication of the detection of one of the three types of failures mentioned above will be designated subsequently as an SOF (state of failure).

Figure 1:
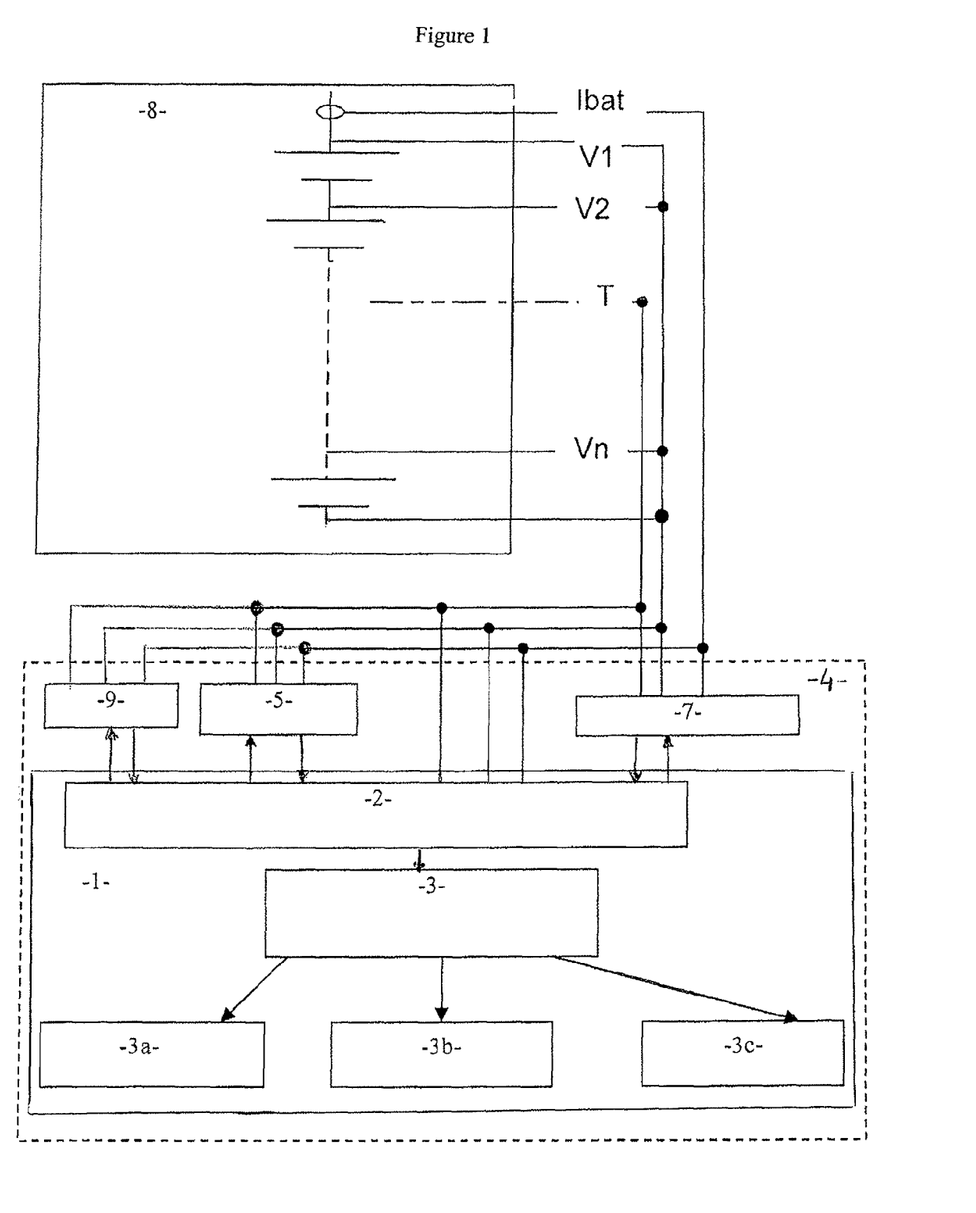
FIG. 1, an explanatory diagram of the monitoring system according to the invention and of its use.

The monitoring system will be described with reference to FIG. 1, which is an explanatory diagram of the monitoring system in an application example. A single branch of accumulators is illustrated in FIG. 1. However the battery may comprise p parallel branches, each parallel branch comprising n accumulators connected in series.

The monitoring system 1 comprises means for measuring the voltage V1, V2, . . . , Vn on the terminals of each accumulator, means for measuring the temperature T of the battery 8, and means for measuring the current Ibat flowing through the battery 8. The monitoring system 1 also comprises means 2 for calculating a difference ΔV between the maximum voltage $V_{max}$ measured on the terminals of one of the accumulators and the minimum voltage $V_{min}$ measured on the terminals of one of the accumulators. The monitoring system 1 also comprises means 3 for comparing the difference ΔV with at least one threshold value ΔVs depending on the measured temperature T and current Ibat; and means 3a, 3b, 3c reporting an error if ΔV≥ΔVs.

According to an embodiment the voltage difference ΔV is compared with a first threshold value ΔVs1 given by the expression $$\Delta Vs1 = n \times R(T) \times \frac{Ibat}{p-1},$$

wherein p is the number of parallel branches of accumulators of the branches of the battery and n is the number of accumulators connected in series in each branch, R(T) is the resistance at the beginning of the life—depending on temperature—of the electrochemical accumulators forming the battery, and Ibat is the charge or discharge current of the battery.

The resistance R depends on temperature and may also depend on the current. The resistance R may be an average value of the resistance at the beginning of the life of the accumulators provided by the manufacturer in a table assigning a resistance value at the beginning of the lifetime for each temperature—current pair (if required). It may alternatively be obtained by performing the average of the resistances at the beginning of the life of the accumulators of the battery. Thus, the threshold value ΔVs1 depends on the measured temperature T and measured current Ibat.

In particular, the comparison of the difference ΔV with the threshold value ΔVs1 is carried out when the battery is operating, i.e. when the Ibat current is non-zero. Different threshold values ΔVs1 may then be defined according to the current required by the application connected to the battery, and according to the conditions of temperature of the application.

The error reporting means 3a of the monitoring system 1 report an error if ΔV≥ΔVs1. Indeed, a voltage difference ΔV between the largest measured voltage value $V_{max}$ and the smallest measured voltage value $V_{min}$ greater than or equal to the threshold value ΔVs1 indicates the presence of an open-circuited accumulator.

Thus, the monitoring system for a battery of the invention allows detection of the presence of a faulty open-circuited accumulator by measuring the voltage at the terminals of each accumulator, by calculating the voltage difference ΔV between the largest measured voltage value $V_{max}$ and the smallest measured voltage value $V_{min}$ and by comparing the difference ΔV with the threshold value ΔVs1. An error signal may then be sent to a user or to other electronic systems.

According to an embodiment, the voltage difference ΔV is compared with a second threshold value ΔVs2 given by the expression $$\Delta Vs2 = \Delta R_{max}(T) \times \frac{Ibat}{p},$$

wherein p is the number of parallel branches of accumulators of the battery, $\Delta R_{max}(T)$ is the tolerated maximum dispersion depending on temperature among the internal resistances of the accumulators, and Ibat is the charge or discharge current of the battery.

The resistance of each accumulator depends on temperature and optionally on the current flowing through it. $\Delta R_{max}$ depends on the temperature and may be determined from tables of resistances at the beginning of the lifetime provided by the manufacturer of the accumulators. Thus, the threshold value ΔVs2 depends on the measured current Ibat and on the temperature of the battery. In particular, the comparison of the difference ΔV with the threshold value ΔVs2 is carried out when the battery is operating i.e. when the Ibat current is non-zero.

The error reporting means 3b of the monitoring system 1 report an error if ΔV≥ΔVs2. Indeed, a voltage difference ΔV between the largest measured voltage value $V_{max}$ and the smallest measured voltage value $V_{min}$ greater than the threshold value ΔVs2 indicates a too large resistance dispersion among the accumulators of the battery. Thus, the threshold value ΔVs2 is selected as the maximum tolerated value for avoiding a too significant hot point. The threshold value ΔVs2 is determined according to the temperature and the current of the battery. For example, the threshold value ΔVs2 may assume a value corresponding to twice the resistance at the beginning of the lifetime at 0° C. multiplied by the battery current and divided by the number of parallel branches of accumulators connected in series.

Thus, by a voltage measurement, the monitoring system 1 according to the invention characterizes the homogeneity of the resistances of the accumulators of the battery without any additional cost as regards the electronic circuits. Indeed, the calculation of the threshold value ΔVs2 requires less computing resources than an estimation of the resistance of each accumulator of the battery. The dispersion among the internal resistances of the accumulators may be due to inhomogeneous aging among the accumulators of the battery. The dispersion between the internal resistances of the accumulators may also be due to a mechanical problem on the power circuit, such as a loose connection screw.

According to an embodiment, the voltage difference ΔV is compared with a third threshold value ΔVs3 having a predetermined value when the battery is not operating, i.e. when the current Ibat is zero, or substantially zero. This third threshold value ΔVs3 is constant for a given temperature, and is set to a value depending on the capacity loss tolerated by a user before proceeding with replacement of the battery. For example for a lithium-ion accumulator battery, it is possible to take a threshold value ΔVs3 of 100 mV allowing a 10% loss of capacity.

The error reporting means 3c of the monitoring system 1 reports an error if ΔV≥ΔVs3.

In an embodiment, the means reporting an error if ΔV≥ΔVs are disabled when the absolute value of the measured current Ibat leaves a range of predetermined current threshold values. The current threshold value range is specific to the threshold value ΔVs. Notably, when the absolute value of the measured current Ibat is less than a threshold value Imin1, the error reporting means if ΔV≥ΔVs1 are disabled; also, when the absolute value of the measured Ibat current is less than a threshold Imin2, the error reporting means if ΔV≥ΔVs2 are disabled.

As described earlier, the threshold values ΔVs1 and ΔVs2 depend on the current Ibat of the battery. The current thresholds Imin1 and Imin2 are set to sufficiently large values so that the threshold values ΔVs1 and ΔVs2 are sufficiently large with respect to the measurement uncertainty of the voltage V of an accumulator. For example, the measurement of the voltage of an accumulator may be accurate to within plus or minus 20 mV, the voltage difference ΔV between the largest measured voltage value $V_{max}$ and the smallest measured voltage value $V_{min}$ is therefore accurate to within plus or minus 20 mV. By selecting Imin1 and Imin2 so that the thresholds ΔVs1 and ΔVs2 are always greater than 100 mV, the risk of false detections due to a measurement error on the voltage is limited.

Also, when the absolute value of the current Ibat of the battery is greater than a threshold value $I_{max}$, the error reporting means if ΔV≥ΔVs3 are disabled. In other words, detection of a large loss in capacity is inhibited when the current Ibat is larger than the $I_{max}$ threshold value. The $I_{max}$ threshold value is determined according to the uncertainty on the measurement of the current for low current values. For example, if a value of the current Ibat of 0 A may be obtained with an uncertainty of plus or minus 2 A, a value of 4 A may be selected for $I_{max}$.

According to an embodiment, the monitoring system for a battery may further comprise means for measuring the current Ibranch flowing through each parallel branch of accumulators connected in series. The monitoring system 1 then comprises means for comparing the current Ibranch for each branch with two thresholds Seuil1 and Seuil2. The current thresholds Seuil1 and Seuil2 depend on the accuracy of the means for measuring the current. The monitoring system 1 also comprises error reporting means if at least one of the parallel branches has a current Ibranch flowing through it of less than Seuil1, while at least one of the parallel branches has a current Ibranch flowing through it of greater than Seuil2.

The monitoring system of the invention comprises one or more threshold values such as the values ΔVs1, ΔVs2, ΔVs3. Thus, with the monitoring system it is possible to detect an SOF of the battery. In other words, the monitoring system of the invention allows detection of a too high capacity loss, and/or high dispersion among the resistances of the accumulators, and/or an open-circuit failure of an accumulator from a voltage or current measurement compared with a criterion depending on the temperature and on the current of the battery.

Figure 2:
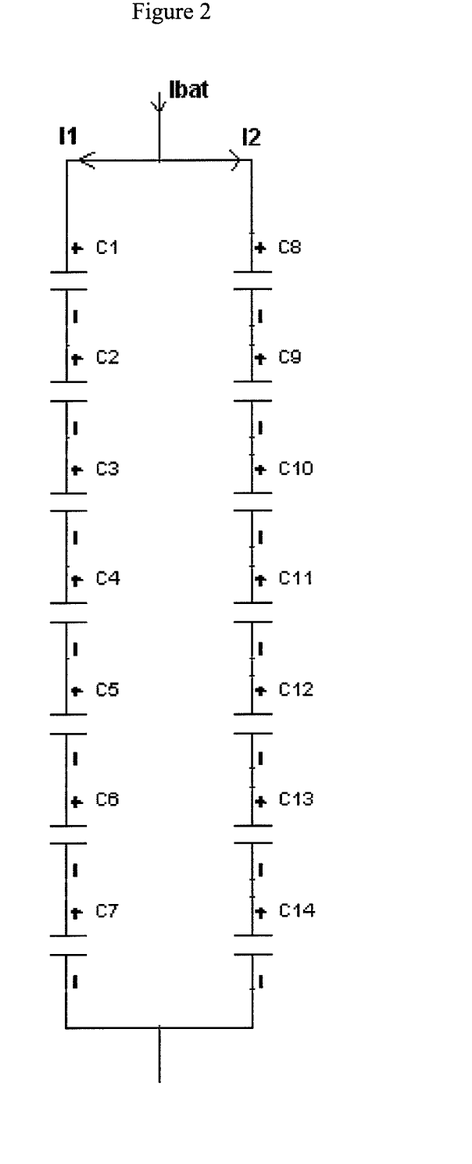
FIG. 2, a battery example using the supervision system according to the invention.

The monitoring system of the invention will be better understood by taking the example of a battery of the 2P7S type, i.e. a battery having two parallel branches each comprising seven accumulators in series as shown in FIG. 2. The battery 2P7S consists of accumulators C1-C14 referenced as Saft VL30P by the applicant.

Figure 3:
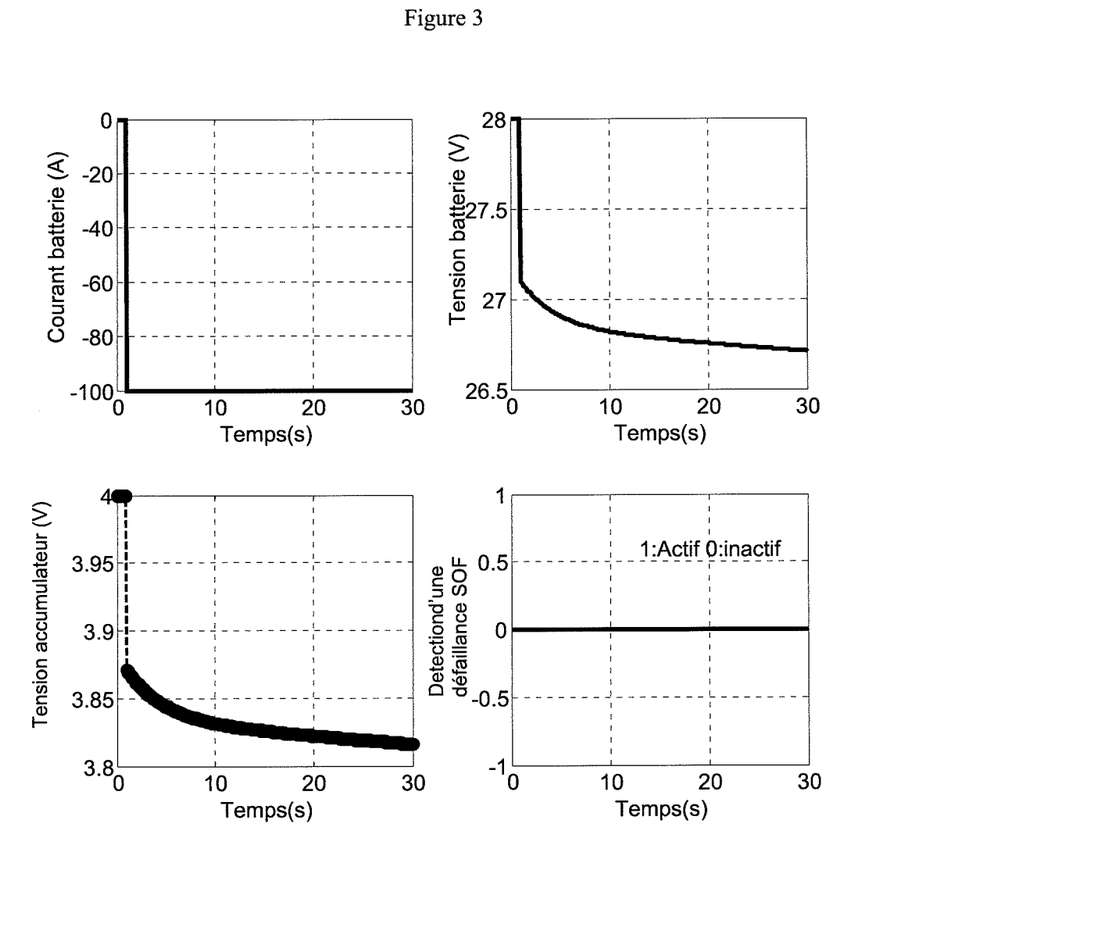
FIG. 3, graphs showing the expected behavior of the battery shown in FIG. 2 when it does not have any dispersion of resistance, any open-circuited accumulators, or a high capacity loss.

FIG. 3 shows failure-free operation of the battery 8. From left to right and from top to bottom, FIG. 3 shows the time-dependent change of the current Ibat flowing through the battery, of the voltage on the terminals of the battery, of the voltage on the terminals of the accumulators of the battery and of the error detection signal. A zero value of the error detection signal indicates absence of failure. The error detection signal assumes the value 1 if a failure is detected.

A few seconds after the initial instant (t=0), the battery is crossed by a constant current of absolute value 100 A, and has a decreasing voltage on its terminals. It is observed that the voltage at the terminals of the accumulators is substantially the same (the respective curves of the accumulators are superposed). Therefore the error detection signal is inactive.

Figure 4:
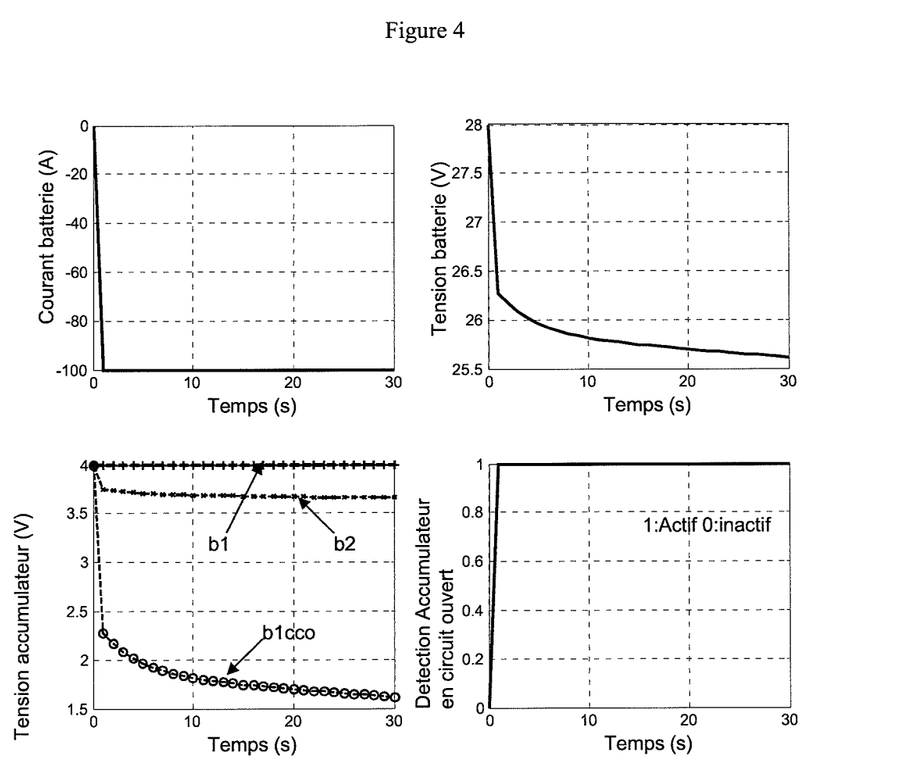
FIG. 4, graphs showing the detection of an open-circuited accumulator among the accumulators of the battery shown in FIG. 2.

FIG. 4 shows a detection of an open-circuited accumulator in the battery 8. The results shown are obtained by simulation at a temperature of 0° C. A first branch of the parallel branches of the battery has an open-circuited accumulator having a voltage which has a time-dependent change according to the curve b1cco. The non-failing accumulators of the first parallel branch have a voltage having a time-dependent change according to the curve b1. The accumulators of the second parallel branch of the battery have a voltage having a time-dependent change according to the curve b2.

When a first parallel branch of the battery 8 comprises an open-circuited accumulator, the totality of the current Ibat of the battery 8 will flow through the accumulators located on the second parallel branch. Assuming that all the accumulators have the same state of charge, each accumulator of the second parallel branch has a voltage V_acc on its terminals, given by the expression:

$$V\_acc = E_0 - R \times Ibat$$

wherein $E_0$ is the electromotive force of the accumulator;
R is the resistance of the accumulator which depends on the temperature of the battery 8 and on the current flowing through the branch containing the accumulator.

The second parallel branch therefore has a voltage on its terminals equal to $7 \times (E_0 - R \times Ibat)$.

In the first parallel branch, the accumulators other than the open-circuited accumulator each have on their terminals a voltage equal to the electromotive force $E_0$ of the accumulator, since no current flows through them. Kirchhoff's mesh law imposing equality of the voltages between two parallel branches, the first parallel branch has a voltage of $7 \times (E_0 - R \times Ibat)$. The voltage $V_{OC}$ on the terminals of the open-circuited accumulator is therefore equal to $$V_{OC} = E_0 - 7 \times R \times Ibat$$

Thus, in the case when one of the parallel branches of the battery 7 has an open-circuited accumulator, the voltage difference ΔV between the largest measured voltage value $V_{max}$ and the smallest measured voltage value $V_{min}$ is equal to $$\Delta V = E_0 - (E_0 - 7 \times R \times Ibat) = 7 \times R \times Ibat$$

This value may define the threshold value ΔVs1. The threshold value ΔVs1 may also assume a value of less than 7×R×Ibat in order to increase the detection sensitivity of an event such as open-circuited accumulator. For example, the threshold value ΔVs1 may be equal to 6×R×Ibat. The resistance R may be obtained from a table giving the resistance at the beginning of the life of the accumulator versus temperature and current. Such a table is generally established from electric tests conducted by the manufacturer.

A voltage difference ΔV greater than or equal to the threshold value ΔVs1 causes switching of the error detection signal to the value 1, indicating the presence of an open-circuited accumulator.

Figure 5:
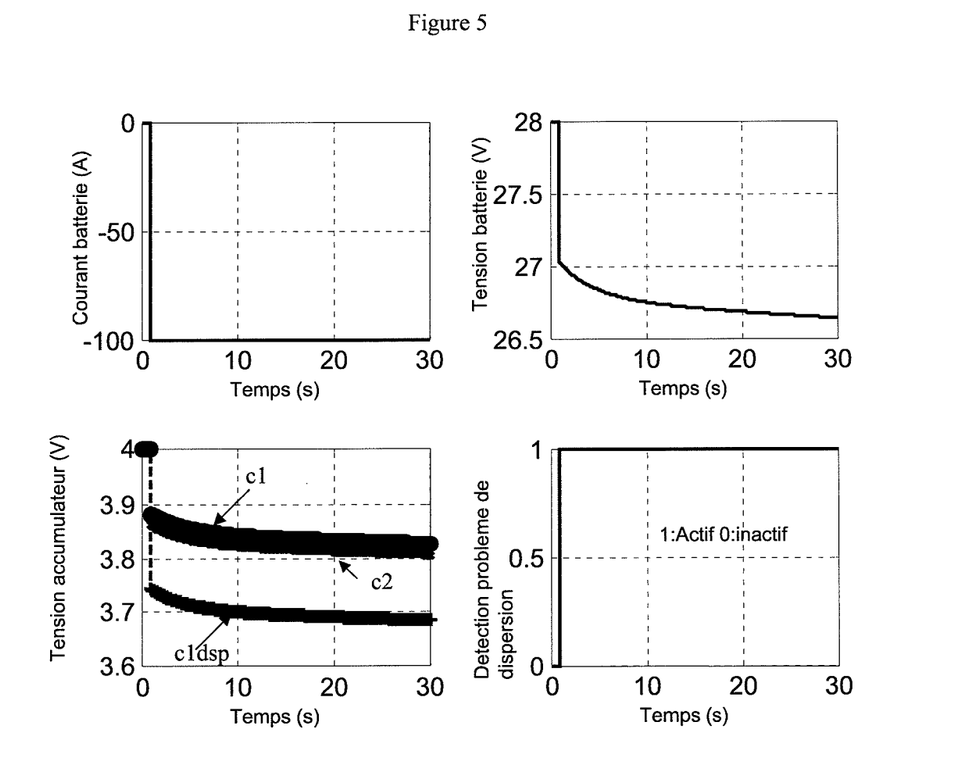
FIG. 5, graphs showing the detection of significant resistance dispersion among the accumulators of the battery shown in FIG. 2.

FIG. 5 shows detection of high resistance dispersion among the accumulators of the battery. The results shown are obtained by simulation at a temperature of 0° C. A first branch of the parallel branches of the battery has an accumulator having a resistance greater by 3 mΩ than that of the other accumulators, and a voltage having a time-dependent change according to the curve c1*dsp*. The non-failing accumulators of the first parallel branch have a voltage having a time-dependent change according to curve c1. The accumulators of the second parallel branch of the battery 2P7S have a voltage having a time-dependent change according to curve c2.

When operating (the current Ibat is therefore non-zero), the voltage difference ΔV between the largest measured voltage value $V_{max}$ and the smallest measured voltage value $V_{min}$ is equal to $$\Delta V = \left(E_{0i} - R_i \times \frac{Ibat}{2}\right) - \left(E_{0j} - R_j \times \frac{Ibat}{2}\right) = \Delta E_{0ij} + \Delta R_{ij} \times \frac{Ibat}{2}$$

wherein $V_{max}$ and are respectively measured on the accumulators i and j, $E_{0i}$, and $E_{0j}$ are the electromotive forces of the accumulators i and j, and $\Delta R_{ij}$ is the resistance difference between the accumulators i and j.

The difference $\Delta E_{0ij}$ between the electromotive forces of the accumulators i and j is substantially zero assuming that the accumulators of the battery do not have any difference in state of charge.

The resistance difference $\Delta R_{ij}$ between the accumulators i and j has to be less than the maximum tolerated dispersion $\Delta R_{max}$ in order to avoid a too significant hot point. This maximum dispersion $\Delta R_{max}$ is determined from resistance tables of the accumulators provided by the manufacturer; it therefore depends on temperature and on current.

Thus, it is possible to select the threshold value ΔVs2, such that $$\Delta Vs2 = \Delta R_{max}(T) \times \frac{Ibat}{p}$$

Thus, the threshold value ΔVs2 depends on the current Ibat and on the temperature of the battery. In the example shown in FIG. 5, the maximum dispersion $\Delta R_{max}$ has a value of 2 mΩ for a temperature of 0° C. The threshold value ΔVs2 may therefore assume the value Ibat.$10^{-3}$. A voltage difference ΔV greater than or equal to the threshold value ΔVs2 causes switching of the error detection signal to the value 1, indicating a too large resistance dispersion among the accumulators of the battery.

According to an embodiment, the detection of an open circuit failure of an accumulator may also be achieved from measurements of the current conducted on each parallel branch of the accumulator. In the case of a battery 2P7S, there would therefore be two means for measuring the current. Thus, when a first parallel branch of the battery 8 comprises at least one open-circuited accumulator, the totality of the current Ibat flows through the accumulators located on the second parallel branch during operation of the battery (non-zero current Ibat). The measured current I1 on the first parallel branch and the measured current I2 on the second parallel branch therefore have the value zero and Ibat respectively.

For example, threshold values Seuil1 and Seuil2 may be set to 4 A and 20 A respectively. Thus if a first parallel branch has a current of less than 4 A and the second branch has a current of more than 20 A, the presence of at least one open-circuited accumulator on the first parallel branch is detected. An error signal may then be sent to a user or to other electronic systems.

The invention also relates to a supervision system 4 for a battery comprising the monitoring system according to the invention as described earlier.

In an embodiment, the supervision system 4 may further comprise a means for determining the state of health SOH 9 of the battery 8. The SOH may be determined in a dynamic way for each module, or for the battery. Alternatively, the SOH may be determined from a predictive model of the aging of accumulators. The determination of SOH is thus less costly in computing time and in electronic resources as compared with a determination of the SOH in real time (i.e. a dynamic determination).

In particular in this embodiment, the measurement of the voltage difference ΔV and its comparison with the threshold values ΔVs1 and ΔVs2 allows estimation of the homogeneity of the resistance of the accumulators of the battery 8. Thus, the supervision system 4 for a battery using a predictive model for the SOH and comprising the monitoring system 1 according to the invention gives the possibility of checking whether the assumption of homogeneous aging among the accumulators of the battery 8 remains valid for determining the SOH from the predictive model.

The predictive model for determining the SOH is invalidated if the voltage difference ΔV is greater than or equal to the first threshold value ΔVs1, which corresponds to the case when one of the accumulators has a failure which may be assimilated to an open circuit.

The predictive model for determining SOH is also invalidated if the voltage difference ΔV is greater than the second threshold value ΔVs2, which corresponds to the case when the dispersion of the resistance among the accumulators is too high. A too high dispersion of the resistance may be due to inhomogeneous aging of the accumulators of the battery 8 or to a mechanical problem in the power circuit, such as a loose connection screw. In this case, the minimum battery voltage which may be used by a user is not guaranteed.

Moreover, the supervision system 4 for a battery according to the invention may further comprise a means for determining the state of charge SOC 5 of the battery 8. The SOC of the battery 8 may be determined from voltage and current measurements of the battery 8, optionally with a model. During the live updating of the SOC of the battery 8 (recalibration phase), the error on the value of SOC is proportional to the maximum resistance of the accumulators of the battery 8 multiplied by the maximum tolerated current for this updating phase. The supervision system 4, by means of the monitoring system 1 according to the invention, from the voltage difference ΔV, checks whether the internal resistances of the accumulators of the battery 8 do not have too significant dispersion which would reduce the accuracy on the value of SOC.

In this embodiment, the supervision system 4 may comprise means for determining the SOC of each accumulator of the battery, and means for determining the dispersion of the state of charge of the accumulators. Said at least one threshold value ΔVs is then corrected if the dispersion of the state of charge is greater than a predetermined value. In other words, the supervision system 4 may comprise means for correcting the threshold values ΔVs according to the dispersion of the state of charge among the accumulators of the battery. The value of the dispersion of the state of charge among the accumulators may be provided by an algorithm determining the SOC of each accumulator. So, the acceptable dispersion of the state of charge among the accumulators may be added to the threshold values ΔVs1 and ΔVs2. For example, if the maximum difference of the state of charge between two elements of the battery is 2%, 20 mV will be added to the threshold values ΔVs1 and ΔVs2.

Moreover, the supervision system 4 for a battery 8 according to the invention may further comprise a system 7 for balancing the charge of the accumulators of the battery 8. The error on the balancing of the battery 8 is proportional to the maximum dispersion on the resistance $\Delta R_{max}$ multiplied by the maximum tolerated current for this balancing phase. The supervision system 4, by means of the monitoring system 1 according to the invention, from the voltage difference ΔV, checks whether the accumulators of the battery 8 do not have any too large resistance dispersion which would reduce the reliability on the balancing of charge of the accumulators of the battery 8.

In particular in this embodiment, the supervision system 4, by means of the monitoring system 1 according to the invention, may compare the difference ΔV with the threshold value ΔVs3 in order to check whether the accumulators of the battery 8 do not have a too high capacity loss. A too high capacity loss would invalidate the balancing between the accumulators of the battery 8, and would cause a power loss for a user and a risk of a too large voltage on certain accumulators.

Figure 6:
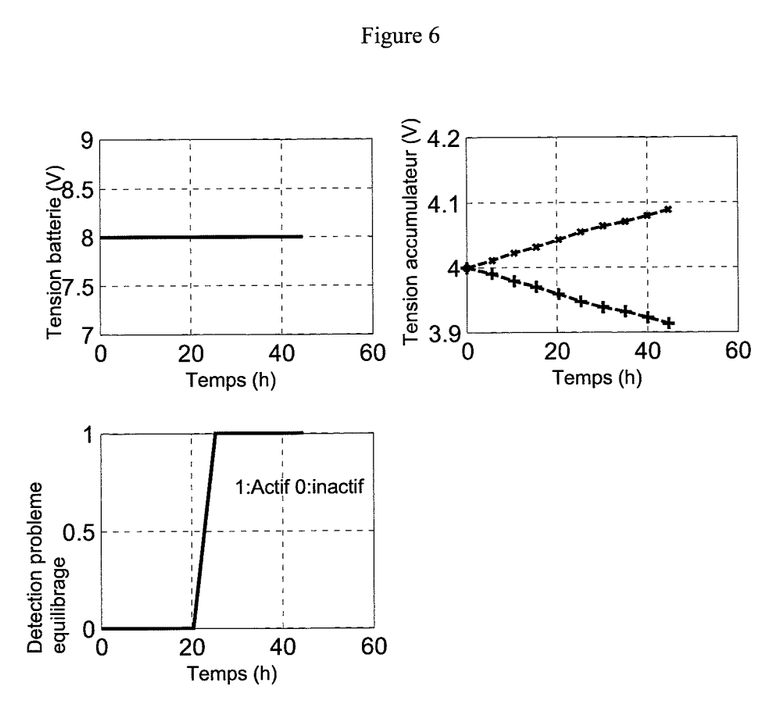
FIG. 6, graphs showing the detection of a high capacity loss in a battery.

FIG. 6 shows the results obtained by simulation on a battery consisting of two accumulators Saft VL30P connected in series and powered by a constant voltage equal to 8V. One of the accumulators has a strong self-discharge current which leads to strong divergence of the voltages on the terminals of both accumulators. With a threshold value ΔVs3 set to 100 mV, the monitoring system reports a failure of the balancing system to the battery supervision system.

In an embodiment of the supervision system 4 for a battery, the error reporting means of the monitoring system 1 give the possibility of warning a user. Thus a user of the battery 8 may be aware of the validity of the SOH and/or SOC values and/or of the balancing of the charges among the accumulators.

The supervision system 4 of the invention may combine differently the various embodiments shown above. For example, the supervision system may comprise a monitoring system according to the invention, a means for determining the SOC and a system for balancing the charge (without determining the SOH). In this case, the threshold value ΔVs2 may be selected as the maximum tolerated value for avoiding a too large error on the SOC algorithm when the latter stems from voltage measurements, and a too large error on the balancing algorithm. In this case, the threshold value ΔVs1 may also be omitted. Also, a supervision system comprising a monitoring system according to the invention, a means for determining the SOC and a means for determining the SOH (without any system for balancing the charge) may be contemplated. In this case, the threshold value ΔVs3 may be omitted. Of course, the supervision system may comprise a monitoring system according to the invention, a means for determining the SOC, a means for determining the SOH and a system for balancing the charge.

By measurements of voltage, current and temperature, the supervision system 4 according to the invention comprising the monitoring system 1 checks the dispersion of the resistance among the accumulators, and the absence of any fault in the power circuit of the battery 8. The supervision system 4 may then determine the validity of the characteristics of the battery 8, such as SOH, SOC and the balancing of the accumulators of the battery 8.

Of course, the present invention is not limited to the embodiments described earlier as an example. The monitoring system 1 according to the invention was presented for a battery 8 of the 2P7S type. However, the number of branches connected in parallel may vary, as well as the number of accumulators connected in series in a branch.

The invention claimed is:

1. A monitoring system for a battery having a plurality of accumulators, the system comprising:
   means for measuring the voltage at the terminals of each accumulator;
   means for measuring the temperature of the battery;
   means for measuring the current flowing through the battery;
   means for calculating a voltage difference between a maximum voltage measured on the terminals of one of the accumulators and a minimum voltage measured on the terminals of one of the accumulators;
   means for comparing the voltage difference with at least one threshold value depending on the measured temperature and current; and
   means reporting an error if the voltage difference is greater than or equal to said at least one threshold value,
   wherein the voltage difference (ΔV) is compared with a threshold value (ΔVs2) defined as $$\Delta Vs2 = \Delta R_{max}(T) \times \frac{Ibat}{p}$$

wherein p is the number of parallel branches of accumulators of the battery,
$\Delta R_{max}(T)$ is the maximum tolerated dispersion among the internal resistances of the accumulators, which depends on the temperature, and
Ibat is the current flowing through the battery.

2. The monitoring system according to claim 1, wherein at least one of the error reporting means is disabled if the absolute value of the measured current leaves a range of current threshold values, the range of values being specific to the threshold value.

3. The monitoring system according to claim 1, wherein the voltage difference between (ΔV) is compared with a threshold value (ΔVs1) defined as $$\Delta Vs1 = n \times R(T) \times \frac{Ibat}{p-1}$$

wherein p is the number of parallel branches of accumulators of the battery, with p≥2, and n is the number of accumulators connected in series in each branch,
R(T) is the resistance at the beginning of the life of the electrochemical accumulators forming the battery, which depends on the temperature, and
Ibat is the current flowing through the battery, and Ibat is non-zero.

4. The monitoring system of claim 1, wherein the voltage difference (ΔV) is compared with a threshold value (ΔVs2) defined as $$\Delta Vs2 = \Delta R_{max}(T) \times \frac{Ibat}{p}$$

wherein p is the number of parallel branches of accumulators of the battery,
$\Delta R_{max}(T)$ is the maximum tolerated dispersion among the internal resistances of the accumulators, which depends on the temperature, and
Ibat is the current flowing through the battery, and
wherein Ibat is non-zero.

5. The monitoring system according to claim 1, for a battery having accumulators assembled in a plurality of parallel branches, the system further comprising:
means for measuring the current flowing through each branch of the battery;
means for comparing the current of each branch with a first threshold and with a second threshold;
means reporting an error if for one of the branches of the battery, the measured current is less than or equal to the first threshold and if for another of the branches of the battery, the measured current is greater than or equal to the second threshold.

6. The monitoring system according to claim 1, wherein the voltage difference is compared with a predetermined threshold value when the current of the battery is substantially zero.

7. A supervision system for a battery comprising:
a monitoring system comprising:
means for measuring the voltage at the terminals of each accumulator;
means for measuring the temperature of the battery;
means for measuring the current flowing through the battery;
means for calculating a voltage difference between a maximum voltage measured on the terminals of one of the accumulators and a minimum voltage measured on the terminals of one of the accumulators;
means for comparing the voltage difference with at least one threshold value depending on the measured temperature and current; and
means reporting an error if the voltage difference is greater than or equal to said at least one threshold value,
the supervision system further comprising:
means for determining the state of charge of the battery,
wherein the voltage difference (ΔV) is compared with a threshold value (ΔVs2) defined as $$\Delta Vs2 = \Delta R_{max}(T) \times \frac{Ibat}{p}$$

wherein p is the number of parallel branches of accumulators of the battery,
$\Delta R_{max}(T)$ is the maximum tolerated dispersion among the internal resistances of the accumulators, which depends on the temperature, and
Ibat is the current flowing through the battery.

8. The supervision system for a battery according to claim 7 comprising:
means for determining the state of charge of each accumulator of the battery,
means for determining the dispersion of the state of charge of the accumulators,
wherein said at least one threshold value is corrected if the dispersion of the state of charge is greater than a predetermined value.

9. The supervision system for a battery comprising:
a monitoring system comprising:
means for measuring the voltage at the terminals of each accumulator;
means for measuring the temperature of the battery;
means for measuring the current flowing through the battery;
means for calculating a voltage difference between a maximum voltage measured on the terminals of one of the accumulators and a minimum voltage measured on the terminals of one of the accumulators;
means for comparing the voltage difference with at least one threshold value depending on the measured temperature and current; and
means reporting an error if the voltage difference is greater than or equal to said at least one threshold value,
the supervision system further comprising:
means for determining the state of health of the battery from a predictive model,
wherein if the voltage difference is greater than at least one threshold value, the error reporting means indicate that the predictive model for determining the state of health is invalid,
wherein the voltage difference (ΔV) is compared with threshold value (ΔVs2) defined as $$\Delta Vs2 = \Delta R_{max}(T) \times \frac{Ibat}{p}$$

wherein p is the number of parallel branches of accumulators of the battery,
$\Delta R_{max}(T)$ is the maximum tolerated dispersion among the internal resistances of the accumulators, which depends on the temperature, and
Ibat is the current flowing through the e battery.

10. The supervision system for a battery comprising:
a monitoring system comprising:
means for measuring the voltage at the terminals of each accumulator;
means for measuring the temperature of the battery;
means for measuring the current flowing through the battery;
means for calculating a voltage difference between a maximum voltage measured on the terminals of one of the accumulators and a minimum voltage measured on the terminals of one of the accumulators;
means for comparing the voltage difference with at least one threshold value depending on the measured temperature when the current of the battery is substantially zero; and
means reporting an error if the voltage difference is greater than or equal to said at least one threshold value,
the supervision system further comprising:
a system for balancing the charge of the accumulators of the battery,
wherein the voltage difference (ΔV) is compared with a threshold value (ΔVs2) defined as $$\Delta Vs2 = \Delta R_{max}(T) \times \frac{Ibat}{p}$$

wherein p is the number of parallel branches of accumulators of the battery, $\Delta T_{max}(T)$ is the maximum tolerated dispersion among the internal resistances of the accumulators, which depends on the temperature, and Ibat is the current flowing through the battery.

11. The supervision system for a battery according claim 7, wherein the error reporting means of the monitoring system give the possibility of warning a user.

12. The supervision system for a battery according claim 9, wherein the error reporting means of the monitoring system give the possibility of warning a user.

13. The supervision system for a battery according claim 10, wherein the error reporting means of the monitoring system give the possibility of warning a user.

\* \* \* \* \*